(12) United States Patent
Shin et al.

(10) Patent No.: US 9,081,122 B2
(45) Date of Patent: Jul. 14, 2015

(54) LIGHT BLOCKING MEMBER AND DISPLAY PANEL INCLUDING THE SAME

(71) Applicant: Samsung Display Co., Ltd., Yongin, Gyeonggi-Do (KR)

(72) Inventors: Hyun-Eok Shin, Yongin (KR); Dae-Woo Lee, Yongin (KR); Won-Pil Lee, Yongin (KR); Ho-Jin Yoon, Yongin (KR); Yong-Woo Park, Yongin (KR); Kyung-Min Choi, Yongin (KR)

(73) Assignee: Samsung Display Co., Ltd., Giheung-Gu, Yongin, Gyeonggi-Do (KR)

(*) Notice: Subject to any disclaimer, the term of this patent is extended or adjusted under 35 U.S.C. 154(b) by 143 days.

(21) Appl. No.: 13/746,397

(22) Filed: Jan. 22, 2013

(65) Prior Publication Data
US 2014/0048829 A1 Feb. 20, 2014

(30) Foreign Application Priority Data
Aug. 17, 2012 (KR) .................. 10-2012-0090234

(51) Int. Cl.
| | |
|---|---|
| H01L 33/00 | (2010.01) |
| G02B 1/00 | (2006.01) |
| G02F 1/1362 | (2006.01) |
| H01L 27/32 | (2006.01) |
| H01L 33/44 | (2010.01) |
| H01L 51/52 | (2006.01) |
| G02B 5/20 | (2006.01) |

(52) U.S. Cl.
CPC *G02B 1/00* (2013.01); *G02B 5/206* (2013.01); *G02F 1/136209* (2013.01); *H01L 27/3272* (2013.01); *H01L 33/44* (2013.01); *H01L 51/5284* (2013.01); *H01L 27/3244* (2013.01); *H01L 2924/0002* (2013.01); *Y10T 428/24942* (2015.01); *Y10T 428/24975* (2015.01)

(58) Field of Classification Search
CPC ................... G02F 1/133512; G02F 1/133504; G02F 1/136209; H01L 51/5268; H01L 27/3272; H01L 27/3258
USPC .......................... 257/59, 72, 83, 98, E33.074
See application file for complete search history.

(56) References Cited

U.S. PATENT DOCUMENTS

| | | |
|---|---|---|
| 2001/0010374 A1 | 8/2001 | Takayama |
| 2007/0069205 A1 | 3/2007 | Jinno |
| 2010/0313875 A1 | 12/2010 | Kennedy |
| 2011/0109596 A1 | 5/2011 | Yoon |

(Continued)

FOREIGN PATENT DOCUMENTS

JP        10048617 A        2/1998

(Continued)

OTHER PUBLICATIONS

XP002718115, D. Hulsenberg : "Cermets" Rompp Online, Version 3.37, Dec. 1, 2011, p. 1-2. Retrieved from the Internet: URL:http://www.roempp.com/prod3/reompp.php [retrieved on Dec. 17, 2013] and its English translation.

Extended European Search Report issued on Jan. 14, 2014 by EPO in connection with European Patent Application No. 13172289.4 which also claims Korean Patent Application No. 10-2012-0090234 as its priority document.

*Primary Examiner* — Minh-Loan T Tran
(74) *Attorney, Agent, or Firm* — Robert E. Bushnell, Esq.

(57) ABSTRACT

A light blocking member including a metal particle and a ceramic material and a display device including the same.

5 Claims, 6 Drawing Sheets

(56) References Cited

U.S. PATENT DOCUMENTS

| | | |
|---|---|---|
| 2011/0199684 A1 | 8/2011 | Hashimoto et al. |
| 2012/0056184 A1 | 3/2012 | Park |

FOREIGN PATENT DOCUMENTS

| | | |
|---|---|---|
| JP | 10341020 A | 12/1998 |
| JP | 11-352310 | 12/1999 |
| JP | 2010-080328 | 4/2010 |
| KR | 10-2006-0046935 | 5/2006 |

US 9,081,122 B2

LIGHT BLOCKING MEMBER AND DISPLAY PANEL INCLUDING THE SAME

CLAIM PRIORITY

This application makes reference to, incorporates the same herein, and claims all benefits accruing under 35 U.S.C. §119 from an application earlier filed in the Korean Intellectual Property Office on 17 Aug. 2012 and there duly assigned Serial No. 10-2012-0090234.

BACKGROUND OF THE INVENTION

1. Field of the Invention

A light blocking member and a display device including the same.

2. Description of the Related Art

A display device expresses an image and for example, includes a liquid crystal display (LCD), an organic light emitting diode (OLED) display, an electrophoretic display device, and the like.

The above information disclosed in this Related Art section is only for enhancement of understanding of the background of the invention and therefore it may contain information that does not form the prior art that is already known to a person of ordinary skill in the art.

SUMMARY OF THE INVENTION

An exemplary embodiment provides for a light blocking member that prevents deterioration of display performance by an external light while reducing an effect on device performance.

Another embodiment provides a display device may include the light blocking member.

According an exemplary embodiment, a light blocking member including a metal particle and a ceramic material is provided.

The metal particle and the ceramic material may be included in a form of a mixture or an alloy.

The metal particle may include silver (Ag), molybdenum (Mo), nickel (Ni), titanium (Ti), tantalum (Ta), or a combination thereof.

The metal particle may have an average particle diameter of about 10 Å to about 1000 Å.

The ceramic material may include niobium oxide, titanium oxide, aluminum oxide, or a combination thereof.

The light blocking member may include a first layer including the metal particle in a first amount and the ceramic material, and a second layer including the metal particle in a second amount that is larger than the first amount and the ceramic material.

The first amount may be included in an amount of about 1 at % to about 15 at % based on the total amount of the metal particle and the ceramic material, and the second amount may be included in an amount of about 10 at % to about 50 at % based on the total amount of the metal particle and the ceramic material.

The first layer may have higher transmittance than the second layer.

The first layer may be disposed more closely to a light incident side than the second layer.

The first layer may have a thickness of about 100 Å to about 1,000 Å, and the second layer may have a thickness of about 500 Å to about 10,000 Å.

According to another embodiment, a display device including the light blocking member is provided.

The display device may include a first substrate, a thin film transistor disposed on the first substrate, a first electrode electrically connected to the thin film transistor, a second electrode facing the first electrode, and an emission layer interposed between the first electrode and the second electrode, wherein the light blocking member may be disposed on at least one region except a region overlapping the first electrode, the second electrode, and the emission layer.

The light blocking member may be positioned between the first substrate and the thin film transistor.

The light blocking member may be positioned between the thin film transistor and the second electrode.

The display device may further include a second substrate facing the first substrate, and the light blocking member may be positioned on one side of the second substrate.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
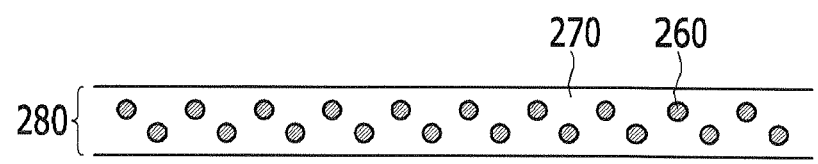
FIG. 1 is a schematic view showing a light blocking member according to one embodiment.

This disclosure will be described more fully hereinafter with reference to the accompanying drawings, in which exemplary embodiments of this disclosure are shown. The inventive concept may, however, be embodied in many different forms and should not be construed as limited to the example embodiments set forth herein. In the drawings, the sizes and relative sizes of layers and regions may be exaggerated for clarity. As those skilled in the art would realize, the described embodiments may be modified in various different ways, all without departing from the spirit or scope of this disclosure.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that when an element or layer is referred to as being, "connected to" or "coupled to" another element or layer, it can be directly connected or coupled to the other element or layer or intervening elements or layers may be present. In contrast, when an element is referred to as being "directly connected to" or "directly coupled to" another element or layer, there are no intervening elements or layers present. Like or similar reference numerals refer to like or similar elements throughout. As used herein, the term "and/or" includes any and all combinations of one or more of the associated listed items.

It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross sectional illustrations that are schematic illustrations of illustratively idealized example embodiments (and intermediate structures) of the inventive concept. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In general, a display device may include a plurality of metal lines and metal electrodes. The metal lines and the metal electrodes have high reflectivity and may reflect light entering from outside. The reflected light may be recognized by a viewer and deteriorate display performance.

In order to decrease the external light reflection, a light blocking member including chromium (Cr) and absorbing an external light has been suggested. However, the light blocking member including chromium (Cr) may increase parasitic capacitance between the light blocking member and the metal lines and/or the light blocking member and the metal electrodes and thus, have an effect on device performance as well as is not environment-friendly.

Hereinafter, referring to FIG. 1, a light blocking member according to one embodiment is described.

FIG. 1 is a schematic view showing a light blocking member according to one embodiment.

Referring to FIG. 1, a light blocking member 280 according to an embodiment which may include a metal particle 260 and a ceramic material 270.

The metal particle 260 and ceramic material 270 may be included in a form of a mixture or an alloy, and the mixture may include, for example the metal particle 260 dispersed in the ceramic material 270.

The metal particle 260 may be made of an opaque metal that may include, for example silver (Ag), molybdenum (Mo), nickel (Ni), titanium (Ti), tantalum (Ta), or a combination thereof. The metal particle 260 may have various sizes, for example an average particle diameter of about 10 Å to about 1,000 Å.

The ceramic material 270 may be metal oxide that may include, for example niobium oxide, titanium oxide, aluminum oxide, or a combination thereof.

The light blocking member 280 may reduce reflectance by scattering and/or absorbing light by the metal particle 260. The light blocking member 280 may have reflectance of less than or equal to about 10%, for example about 1% to about 10%.

In addition, the light blocking member 280 may have high resistance due to the ceramic material 270 and thus may prevent parasitic capacitance from increasing between the light blocking member 280 and a metal line and/or between the light blocking member 280 and a metal electrode. Thus, deterioration of the device performance due to parasitic capacitance may be prevented. The light blocking member 280 may have sheet resistance ranging from about 1kΩ/☐ (resistance per square) to 100MΩ/☐ within a thickness range of about 2,000 Å.

Figure 2:
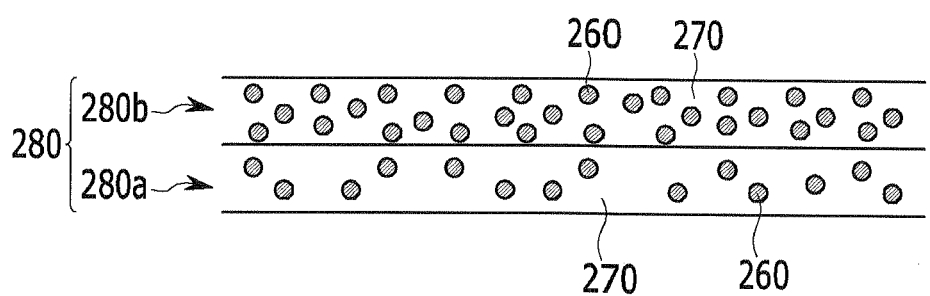
FIG. 2 is a schematic view showing a light blocking member according to another embodiment.

FIG. 2 is a schematic view showing a light blocking member according to another exemplary embodiment.

Referring to FIG. 2, the light blocking member 280 according to another embodiment may include a plural layer may include the first layer 280a and the second layer 280b.

The first layer 280a may include a metal particle 260 in a first amount and a ceramic material 270, and the second layer 280b may include the metal particle 260 in a higher second amount than the first amount and the ceramic material 270. The second amount has no particular limit, as long as it is higher than the first amount. For example, the first amount may be in a range of about 1 at % to about 15 at % based on the total amount of the metal particle 260 and the ceramic material 270, while the second amount may be in a range of about 10 at % to about 50 at % based on the total amount of the metal particle 260 and the ceramic material 270.

The first layer 280a may have high transmittance, since metal particles are less disposed therein than in the second layer 280b, and accordingly, may be disposed close to a light incident side. The second layer 280b may increase light scattering and absorption and thus, light blocking effects, since metal particles are more disposed in the second layer 280b than the first layer 280a. The first layer 280a may partly scatter and absorb an external light, and then, the second layer 280b may mostly scatter and absorb the light passed from the first layer 280a and thus, may decrease the light reflection from the first layer 280a.

The first layer 280a may have a thickness of about 100 Å to about 1,000 Å, and the second layer 280b may have a thickness of about 500 Å to about 10,000 Å.

The aforementioned light blocking member 280 may be applied to a display device.

The display device may include, for example, a liquid crystal display (LCD), an organic light emitting diode (OLED) display, an electrophoresis display device, and the like, but the present invention is not limited thereto.

The light blocking member 280 may decrease reflection of an external light entering the display device and prevent performance deterioration of the display device, as a reflected light is recognized by a viewer. Accordingly, the light blocking member 280 does not need a separate polarizing plate on the front side of a display device to decrease the external light reflection and thus, may decrease cost and simultaneously, improve light efficiency.

Hereinafter, a display device according to one embodiment is illustrated.

Herein, an organic light emitting diode (OLED) display as an example of the display device is illustrated referring to the following drawings.

Figure 3:
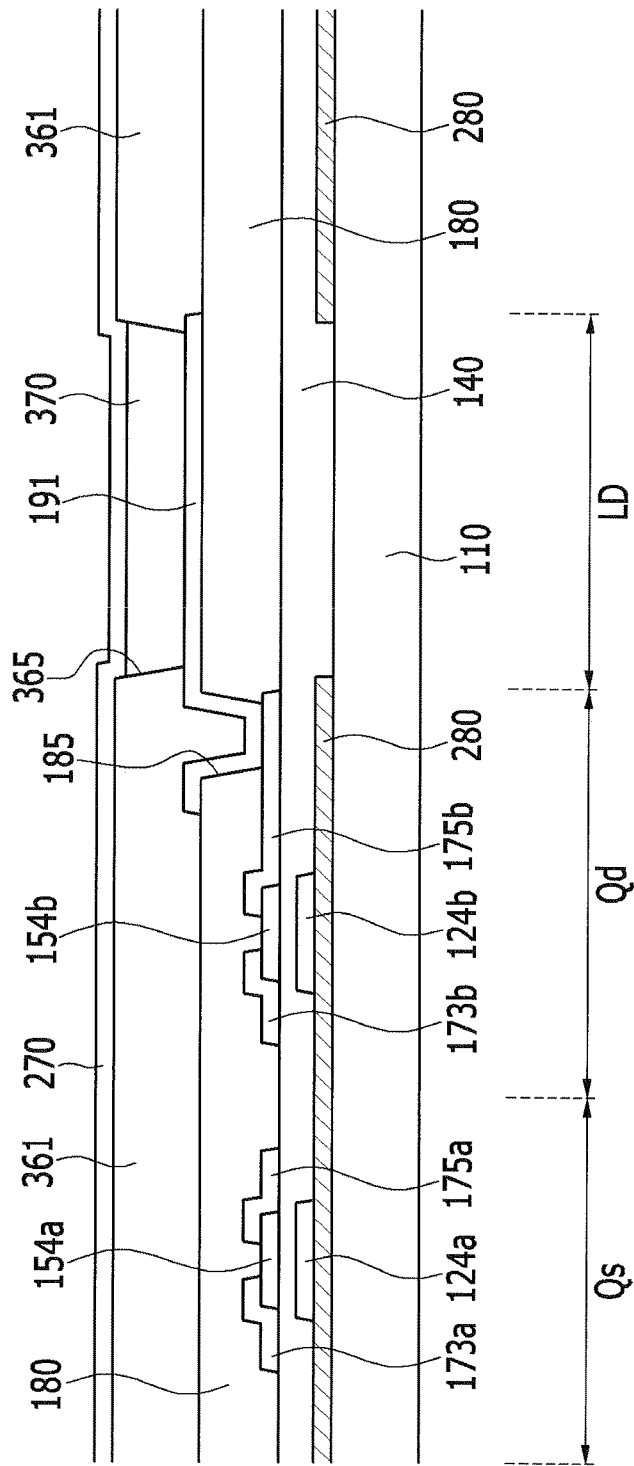
FIG. 3 is a schematic view showing an organic light emitting diode (OLED) display according to one embodiment.

FIG. 3 is a schematic view showing an organic light emitting diode (OLED) display according to one embodiment.

Referring to FIG. 3 an organic light emitting diode (OLED) display according to one embodiment may include a switching transistor region (Qs) including a switching thin film transistor, a driving transistor region (Qd) including a driving thin film transistor, and a light emitting region (LD) including an organic light emitting diode (OLED) in each pixel.

The switching thin film transistor has a control terminal, an input terminal, and an output terminal. The control terminal may be connected to a gate line (not shown). The input terminal may be connected to a data line (not shown). The output terminal may be connected to a driving thin film transistor. The switching thin film transistor responds to a scan signal applied to the gate line and transfers the data signal to the driving thin film transistor.

The driving thin film transistor also has a control terminal, an input terminal, and an output terminal. The control terminal may be connected to the switching thin film transistor. The input terminal may be connected to a driving voltage line (not shown). The output terminal may be connected to an organic light emitting diode (OLED). The driving thin film transistor may shed an output current with a different size depending on a voltage between the control and output terminals.

The organic light emitting diode (OLED) includes an anode connected to the output terminal of the driving thin film transistor and a cathode connected to a common voltage. The organic light emitting diode (OLED) emits a light depending on strength of the output current of the driving thin film transistor and displays an image.

Referring to FIG. 3, a light blocking member 280 may be disposed on a transparent substrate 110 may include a glass substrate, a polymer layer, silicon wafer, or the like. The light blocking member 280 may be formed in a part of region except for a light emitting region where a pixel electrode 191, an organic light emitting member 370, and a common electrode 270 illustrated later are overlapped one another and specifically, all the region except for the light emitting region.

The light blocking member 280 may be formed of a single layer or a multi-layer including a metal particle and a ceramic material as aforementioned. The multilayered light blocking member may include the different amount of the metal particle in each layer. When the substrate 110 is a viewing side, a first layer may include a metal particle in a first amount and a ceramic material and a second layer may include a metal particle in a second amount that is larger than the first amount and a ceramic material may be sequentially laminated on the substrate 110.

On the light blocking member 280, a switching control electrode 124a and a driving control electrode 124b are formed. The switching control electrode 124a may be connected to a gate line (not shown) and receives a gate signal from the gate line. The driving control electrode 124b may be an island-type.

Then, a gate insulating layer 140 may be formed on the entire surface of the substrate 110 including the switching control electrode 124a and driving control electrode 124b.

On the gate insulating layer 140, a switching semiconductor 154a and a driving semiconductor 154b are formed. The switching semiconductor 154a is overlapped with the switching control electrode 124a, and the driving semiconductor 154b is overlapped with the driving control electrode 124b. The switching semiconductor 154a and the driving semiconductor 154b may be respectively island-types.

On the switching semiconductor 154a, a switching input electrode 173a and a switching output electrode 175a electrically connected to the switching semiconductor 154a are formed. The switching input electrode 173a may be connected to a data line (not shown) and receives a data signal from the data line. The switching output electrode 175a may be connected to a post-illustrated driving control electrode 124b.

On the driving semiconductor 154b, a driving input electrode 173b and a driving output electrode 175b electrically connected to the driving semiconductor 154b are formed. The driving input electrode 173b may be connected to a driving voltage line (not shown). The driving output electrode 175b may be connected to a post-illustrated pixel electrode 191.

On the switching input electrode 173a, the switching output electrode 175a, the driving input electrode 173b, and the driving output electrode 175b, a protective layer 180 is formed. The protective layer 180 has a contact hole 185 exposing the driving output electrode 175b.

On the protective layer 180, a pixel electrode 191 may be formed. The pixel electrode 191 may be connected to the driving output electrode 175b through the contact hole 185. The pixel electrode 191 may be made of, for example, conductive oxide, indium tin oxide (ITO), indium zinc oxide (IZO), aluminum doped zinc oxide (AZO), indium gallium zinc oxide (IGZO), or a combination thereof.

On the pixel electrode 191, a pixel definition layer 361 may be formed. The pixel definition layer 361 has an opening 365 exposing the pixel electrode 191. The pixel definition layer 361 surrounding the opening 365 defines a light emitting region (LD). The light emitting region (LD) may be formed where the pixel electrode 191 and a post-illustrated organic light emitting member 370 and common electrode 270 are overlapped one another. The pixel definition layer 361 may be formed of, for example, a photosensitive organic material.

In the light emitting region (LD) surrounded by the pixel definition layer 361, an organic light emitting member 370 may be formed.

The organic light emitting member 370 includes an emission layer and an auxiliary layer.

The emission layer may be made of an organic material emitting one light among primary colors such as red, green, blue, and the like or may display a white by combination of colors.

The auxiliary layer may be positioned at least either on or under the emission layer and may include at least one selected from a hole injection layer (HIL), a hole transport layer (HTL), an electron injection layer (EIL), and an electron transport layer (ETL).

On the pixel definition layer 361 and the organic light emitting member 370, a common electrode 270 may be formed. The common electrode 270 may be formed of a transparent metal or a metal having a high reflectivity.

In the aforementioned organic light emitting device, either one of the pixel electrode 191 and the common electrode 270 is an anode, while the other is a cathode. The anode and the cathode as a pair flow a current to the organic light emitting member 370.

According to the embodiment, the light blocking member 280 may be formed in a region except for the light emitting region (LD) and scatters and/or absorbs a light entering outside and thus, may prevent the light from being reflected by an electrode and a wire and going out again. Accordingly, the light blocking member 280 may prevent visibility deterioration by an external light reflection.

In addition, the light blocking member 280 has high resistance and thus, may decrease parasitic capacitance with an electrode and a wire and reduce an effect on operation of a device.

Hereinafter, referring to FIG. 4, an organic light emitting diode (OLED) display according to another embodiment is illustrated.

Figure 4:
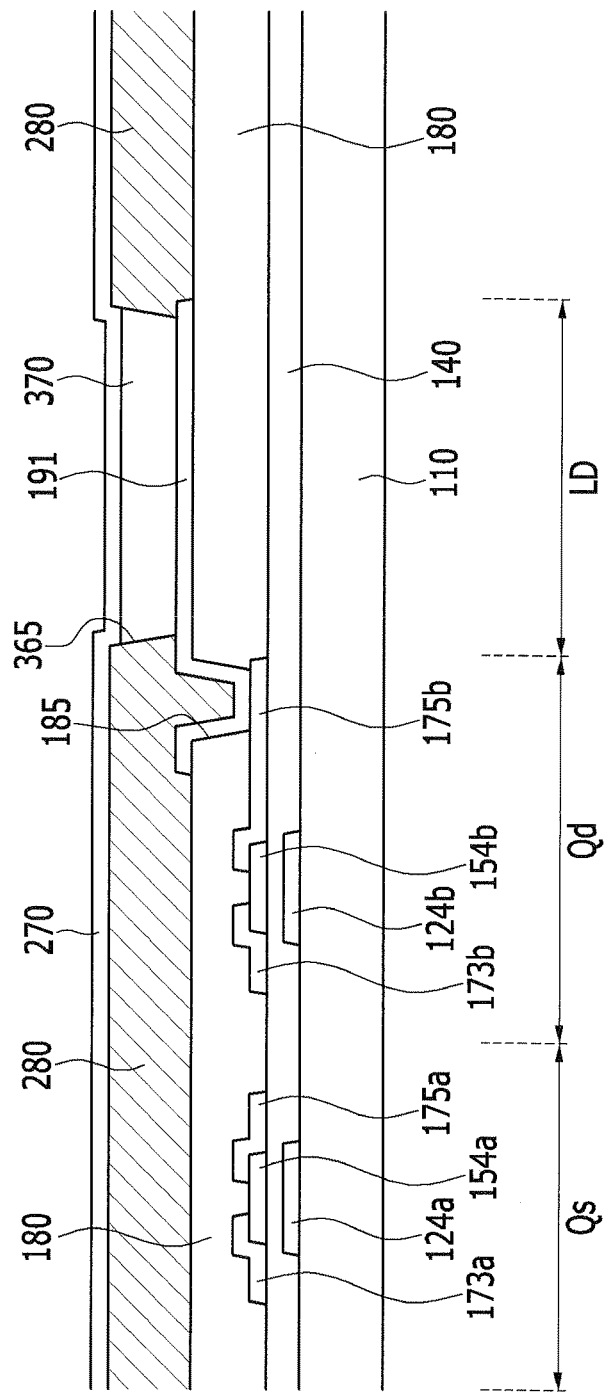
FIG. 4 is a cross-sectional view showing an organic light emitting diode (OLED) display according to another embodiment.

FIG. 4 is a cross-sectional view showing an organic light emitting diode (OLED) display according to another embodiment.

Referring to FIG. 4, an organic light emitting diode (OLED) display according to the embodiment, like one according to the aforementioned embodiment, include a switching transistor region (Qs), a driving transistor region (Qd), and a light emitting region (LD) and includes a switching control electrode 124a, a driving control electrode 124b, a gate insulating layer 140, a switching semiconductor 154a, a driving semiconductor 154b, a switching input electrode 173a, a switching output electrode 175a, a driving input electrode 173b, a driving output electrode 175b, a protective layer 180, a contact hole 185, a pixel electrode 191, an organic light emitting member 370, and a common electrode 270.

However, the organic light emitting diode (OLED) display according to the embodiment, unlike one according to the aforementioned embodiment, includes a light blocking member 280 formed in a region except for a light emitting region (LD) between the thin film transistor and the common electrode 270, where the pixel electrode 191, the organic light emitting member 370, and the common electrode 270 are overlapped, rather than directly formed on a substrate 110.

The light blocking member 280 may simultaneously play a role of a pixel definition layer defining each pixel.

The light blocking member 280 may be formed of a single layer or a multilayer including metal particles and a ceramic material as aforementioned. The multilayered light blocking member may include the different amounts of metal particles in each layer.

When the substrate 110 is a viewing side, a first layer may include a metal particle in a first amount and a ceramic material and a second layer may include a metal particle in a second amount that may be larger than the first amount and a ceramic material may be sequentially laminated on the protective layer 180 and the pixel electrode 191. When common electrode 270 is a viewing side, the first and second layers may be laminated in an opposite way.

According to the embodiment, the light blocking member 280 may be formed in a region except for a light emitting region (LD) and scattering and absorbing a light entering outside and thus, preventing the external light from being reflected by an electrode and a wire and going out again. Accordingly, the light blocking member 280 may prevent visibility deterioration by an external light reflection.

In addition, the light blocking member 280 has high resistance and thus, may decrease parasitic capacitance with an electrode and a wire and thus reduce an effect on operation of a device.

Hereinafter, referring to FIG. 5, an organic light emitting diode (OLED) display according to still another embodiment is illustrated.

Figure 5:
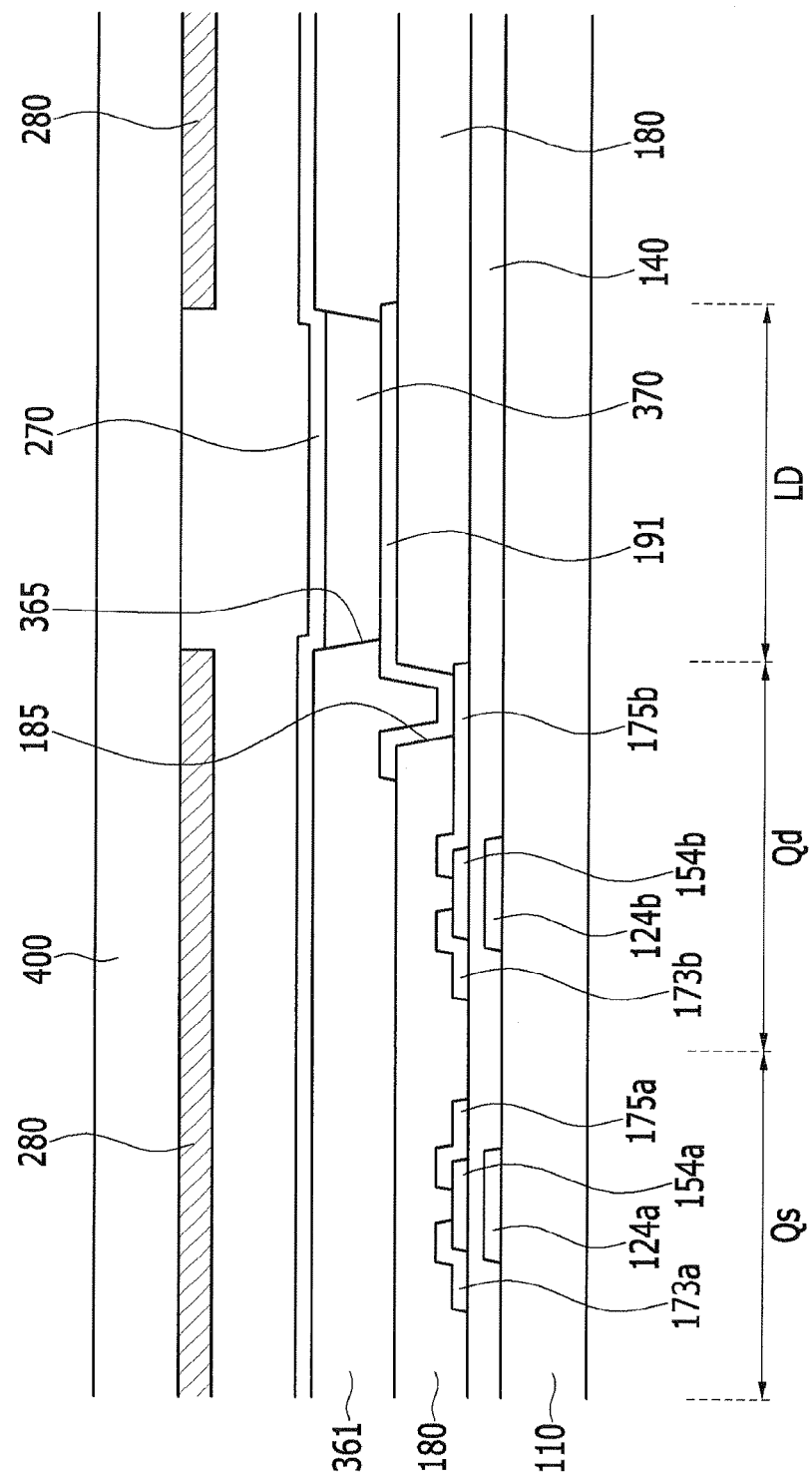
FIG. 5 is a cross-sectional view showing an organic light emitting diode (OLED) display according to further embodiment.

FIG. 5 is a cross-sectional view showing an organic light emitting diode (OLED) display according to further embodiment.

Referring to FIG. 5, an organic light emitting diode (OLED) display according to the embodiment, like one according to the aforementioned embodiment, includes a switching transistor region (Qs), a driving transistor region (Qd), and a light emitting region (LD) and includes a switching control electrode 124a, a driving control electrode 124b, a gate insulating layer 140, a switching semiconductor 154a, a driving semiconductor 154b, a switching input electrode 173a, a switching output electrode 175a, a driving input electrode 173b, a driving output electrode 175b, a protective layer 180, a contact hole 185, a pixel electrode 191, an organic light emitting member 370, and a common electrode 270.

However, the organic light emitting diode (OLED) display according to the embodiment, unlike one according to the aforementioned embodiment, includes a light blocking member 280 formed on one surface of an encapsulation substrate 400. The encapsulation substrate 400 may be formed of a metal, a polymer, and the like and disposed facing the substrate 100. Specifically, the light blocking member 280 may be formed in a region except for a light emitting region (LD), where a pixel electrode 191, an organic light emitting member 370, and a common electrode 270 are overlapped one another, on one surface of the encapsulation substrate 400 facing the substrate 110.

The light blocking member 280 may be formed of a single layer or a multilayer including a metal particle and a ceramic material. The multilayered light blocking member may include the metal particle in a different amount in each layer.

When the substrate 110 is a viewing side, a first layer may include a metal particle in a first amount and a ceramic material and a second layer may include the metal particle in a second amount that may be larger than the first amount and the ceramic material may be sequentially laminated on the protective layer 180 and the pixel electrode 191. When the common electrode 270 is a viewing side, the first and second layers may be laminated in an opposite way.

According to the embodiment, the light blocking member 280 may be formed in a region except for a light emitting region (LD) and scattering and absorbing a light entering outside and thus, preventing the light from being reflected by an electrode and a wire and going out again. Accordingly, the light blocking member 280 may prevent visibility deterioration by an external light reflection.

In addition, the light blocking member 280 has high resistance and thus, may decrease parasitic capacitance with an electrode and a wire and reduce an effect on operation of a device.

The following examples illustrate the present invention in more detail. These examples, however, are not in any sense to be interpreted as limiting the scope of this disclosure.

Formation of Light Blocking Member

EXAMPLE 1

A mixture target of 15 at % of molybdenum (Mo) particles and 85 at % of a niobium oxide was prepared. Then, the mixture was sputtered on a glass substrate to form a 1300 Å-thick light blocking member.

EXAMPLE 2

A mixture target of 15 at % of molybdenum (Mo) particles and 85 at % of a niobium oxide was prepared. Then, the mixture was sputtered on a glass substrate to form a 1500 Å-thick light blocking member.

EXAMPLE 3

A mixture of 5 at % of molybdenum (Mo) particles and 95 at % of a niobium oxide was prepared. Then, the mixture was sputtered on a glass substrate to form a 500 Å-thick lower light blocking member. Then, a mixture of 15 at % of molybdenum (Mo) particles and 85 at % of a niobium oxide was prepared. Then, the mixture was sputtered thereon to form an 800 Å-thick upper light blocking member.

COMPARATIVE EXAMPLE

Chromium (Cr) was sputtered on a glass substrate to form a 700 Å-thick light blocking member.

Evaluation 1: Sheet Resistance

The light blocking members according to Examples 1 to 3 and Comparative Example were evaluated regarding sheet resistance.

The sheet resistance was measured in a 4-point probe method.

The results are provided in Table 1.

TABLE 1

|  | Sheet resistance (kΩ/□) |
|---|---|
| Example 1 | 71 |
| Example 2 | 67 |
| Example 3 | 60 |
| Comparative Example | 4 |

Evaluation 2: Reflectance

The light blocking member according to Example 3 was evaluated regarding reflectance.

The reflectance was measured using a UV-Vis spectrophotometer.

Figure 6:
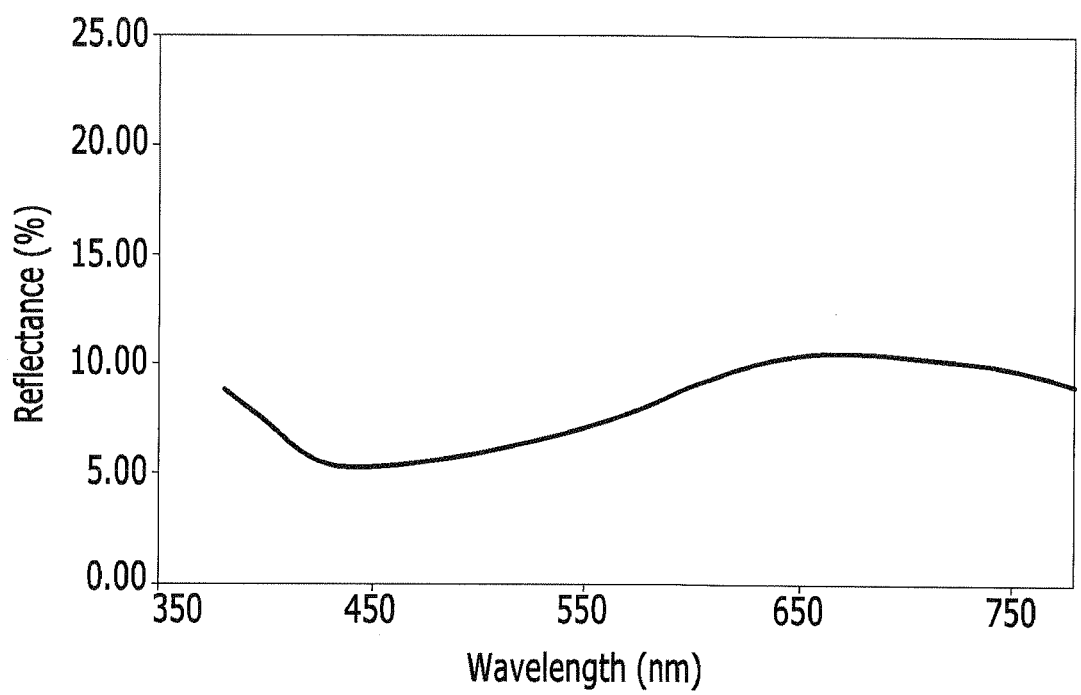
FIG. 6 is a graph showing the reflectance of the light blocking member according to Example 3.

The result is provided in FIG. 6.

FIG. 6 is a graph showing reflectance of the light blocking member according to Example 3.

Referring to FIG. 6, the light blocking member according to Example 3 had a reflectance of less than or equal to about 10% and specifically, about 5% to about 9% in a visible ray region ranging from about 400 nm to about 780 nm. Considering that a glass substrate itself had a reflectance of about 4%, the light blocking member according to Example 3 had a relatively low reflectance ranging from about 1 to about 5%.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device, comprising:
   a first substrate;
   a thin film transistor disposed on the first substrate;
   a first electrode electrically connected to the thin film transistor;
   a second electrode facing the first electrode;
   an emission layer interposed between the first electrode and the second electrode; and
   a light blocking member, the light blocking member comprising a metal particle and a ceramic material, said metal particle consisting of silver (Ag), molybdenum (Mo), nickel (Ni), titanium (Ti), tantalum (Ta), or a combination thereof, and said ceramic material consisting of niobium oxide, titanium oxide, or a combination thereof,
   wherein the light blocking member is disposed on at least one region except a region overlapping the first electrode, second electrode, and emission layer, and
   wherein the light blocking member is positioned between the thin film transistor and the second electrode.

2. The display device of claim 1, wherein the metal particle and ceramic material are included in a form of a mixture or an alloy.

3. The display device of claim 1, wherein the light blocking member comprises:
   a first layer including the metal particle in a first amount and ceramic material, and
   a second layer including the metal particle in a second amount that is larger than the first amount and ceramic material.

4. The display device of claim 3, wherein the first layer is disposed more closely to a light incident side than the second layer, and the first layer has higher transmittance than the second layer.

5. The display device of claim 3, wherein the first layer has a thickness of about 100 Å to about 1,000 Å, and the second layer has a thickness of about 500 Å to about 10,000 Å.

* * * * *